United States Patent
Chang et al.

(10) Patent No.: US 7,903,858 B2
(45) Date of Patent: Mar. 8, 2011

(54) PRACTICAL IMAGE RECONSTRUCTION FOR MAGNETIC RESONANCE IMAGING

(75) Inventors: Ti-chiun Chang, Princeton Junction, NJ (US); Jiayu Song, Reston, VA (US); Tong Fang, Morganville, NJ (US); Peter Speier, Erlangen (DE); Edgar Müller, Heroldsbach (DE)

(73) Assignee: Siemens Aktiengesellschaft, Munich (DE)

(*) Notice: Subject to any disclaimer, the term of this patent is extended or adjusted under 35 U.S.C. 154(b) by 799 days.

(21) Appl. No.: 11/926,912

(22) Filed: Oct. 29, 2007

(65) Prior Publication Data
US 2008/0107319 A1 May 8, 2008

Related U.S. Application Data

(60) Provisional application No. 60/864,189, filed on Nov. 3, 2006.

(51) Int. Cl.
G06K 9/00 (2006.01)
A61B 5/05 (2006.01)

(52) U.S. Cl. .................. 382/131; 382/280; 600/410

(58) Field of Classification Search ............ 382/128, 382/129, 139, 131, 132, 133, 134, 162, 168, 382/173, 181, 232, 254, 255, 260, 274, 275, 382/276, 280, 291, 305, 312; 324/309; 600/410; 378/4, 21, 23
See application file for complete search history.

(56) References Cited

U.S. PATENT DOCUMENTS

| | | | |
|---|---|---|---|
| 6,853,191 B1 * | 2/2005 | Miller et al. | 324/309 |
| 7,076,091 B2 * | 7/2006 | Rosenfeld | 382/131 |
| 7,418,287 B2 * | 8/2008 | Tsao et al. | 600/410 |
| 7,439,739 B2 * | 10/2008 | Beatty | 324/309 |
| 7,592,809 B1 * | 9/2009 | King et al. | 324/309 |
| 7,634,119 B2 * | 12/2009 | Tsougarakis et al. | 382/128 |

OTHER PUBLICATIONS

T-C. Chang, et al., "MR Image Reconstruction from Sparse Radial Samples Using Bregman Iteration", Proc. of Annual Meeting of ISMRM, Seattle, WA, USA, May 2006.
J.A. Fessler, et al., "Conjugate-Gradient Preconditioning Methods for Shift-Variant PET Image Reconstruction", IEEE Transactions on Image Processing, vol. 8, No. 5, 1999.
J.A. Fessler, et al., "Toeplitz-Based Iterative Image Reconstruction for MRI with Correction for Magnetic Field Inhomogeneity", IEEE Trans. on Signal Proces., 53(9), 2005.
Q.H. Liu, et al., "Iterative Algorithm for Nonuniform Inverse Fast Fourier Transform (NU-IFFT)", Electronics Letters, vol. 34, No. 20, Oct. 1, 1998.
J.G. Pipe, "Reconstructing MR Images from Undersampled Data: Data-Weighting Considerations", Magnetic Resonance in Medicine 43, 2000.
J.G. Pipe, et al., "Sampling Density Compensation in MRI: Rationale and an Iterative Numerical Solution", Magnetic Resonance in Medicine 41, 1999.
J.R. Shewchuk, "An Introduction to the Conjugate Gradient Method without the Agonizing Pain", Carnegie Mellon University, Pittsburgh, PA, 1994.
R. Van De Walle, et al., "Reconstruction of MR Images from Data Acquired on a General Nonregular Grid by Pseudoinverse Calculation", IEEE Trans. on Med. Imaging, 19(12), 2000.

* cited by examiner

*Primary Examiner* — Seyed Azarian

(57) ABSTRACT

A set of image-space data is reconstructed from a set of k-space data. The set of image-space data is generated by minimizing a cost functional by an iterative non-linear conjugate gradient process. The iterative process may be accelerated by introducing k-space weighting to the cost functional. With proper choice of k-space weighting, a block-Toeplitz matrix is generated which permits use of Fast Fourier Transform techniques. An image is rendered from the set of image-space data.

18 Claims, 3 Drawing Sheets

PRACTICAL IMAGE RECONSTRUCTION FOR MAGNETIC RESONANCE IMAGING

This application claims the benefit of U.S. Provisional Application No. 60/864,189 filed Nov. 3, 2006, which is incorporated herein by reference.

BACKGROUND OF THE INVENTION

The present invention relates generally to medical imaging, and more particularly to iterative reconstruction of images.

Magnetic Resonance Imaging (MARI) has become a well-established medical diagnostic tool for imaging structures within the body of a patient. Image quality may be characterized by a host of parameters, including resolution, field of view, contrast, edge definition, and artifacts (for example, ghosts and streaks). Under a broad range of conditions, image quality improves with increasing data acquisition time. If the data acquisition time is increased, however, the patient is subjected to a longer scan time, which increases patient discomfort. In some instances, long scan times may actually degrade image quality because of movement of the region of interest during the scan. Short scan times are also necessary for near-real-time measurements, such as used in functional MRI. There is, thus, a trade-off between image quality and scan time.

Images are displayed on physical media; for example, emulsions on film or pixels on a monitor. The normal physical world may be referred to as real space. In one method for producing high-quality images, MR signals are captured in k-space. In some fields of study, k-space is also referred to as spatial-frequency domain. In general terms, data values in real space are then generated by taking the inverse Fourier transform of data values in k-space. In general, MR signals are not measured as a continuous function of position in k-space. They are sampled at discrete k-values. Subject to specific constraints and boundary conditions, image quality generally improves as the density and range of discrete k-space sampling points are increased. Recording a large number of samples, however, has disadvantages. One is the extended scan time discussed above. The other is low temporal resolution.

To reduce data acquisition time, MRI data are often intentionally under-sampled. This will, however, often lead to reduced signal-to-noise ratio (SNR) and to image degradation. Various techniques have been developed to enhance the image quality reconstructed from under-sampled data, but they require extended computational time and high memory usage. What is needed is a method which reduces computational time and memory usage for generating high quality real-space images from under-sampled k-space data.

BRIEF SUMMARY OF THE INVENTION

An image is rendered from a set of k-space data by first reconstructing a set of image-space data from the set of k-space data. The set of image-space data is generated by iteratively solving for the minimum of a cost functional comprising a weighting matrix. With proper choice of the weighting matrix, a block-Toeplitz matrix is generated. The set of k-space data and an initial image-space data are inputted into a non-linear conjugate gradient process for iteratively reconstructing image-space data. The k-space weighting matrix and the block-Toeplitz matrix accelerate the iterative solution process. These and other advantages of the invention will be apparent to those of ordinary skill in the art by reference to the following detailed description and the accompanying drawings.

DETAILED DESCRIPTION

Figure 1:
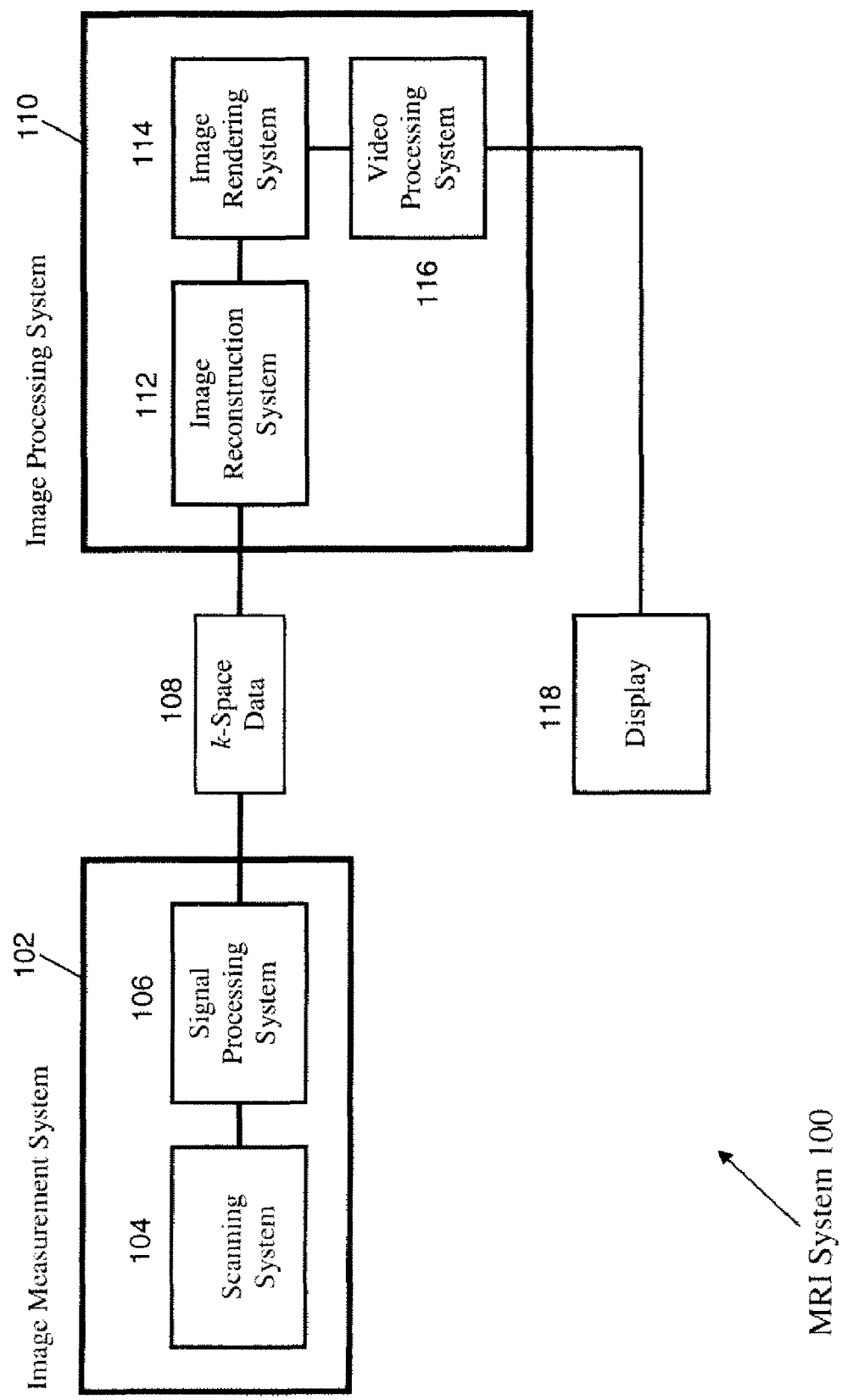
FIG. 1 shows a high-level schematic of an MRI system.

FIG. 1 shows a high-level schematic of the functional architecture of a representative imaging system. In the example shown in FIG. 1, the imaging system is MRI system 100. Embodiments apply to other modalities. MRI system 100 comprises image measurement system 102, image processing system 110, and display 118. Image measurement system 102 may include scanning system 104 and signal processing system 106. Scanning system 104 includes the MRI scanner and associated instrumentation and software. The output of scanning system 104 are radio-frequency (RF) signals which are fed into signal processing system 106. Signal processing system 106 includes hardware and software which converts the RF signals to k-space data 108, which is discussed further below.

The k-space data 108 is then fed into image processing system 110, which may include image reconstruction system 112, image rendering system 114, and video processing system 116. Image reconstruction system 112, further discussed below, transforms k-space data 108 into image-space data, which may be a two-dimensional (2-D) or three-dimensional (3-D) dataset. Herein, image space refers to real space. Herein, image reconstruction refers to the transformation of k-space data to image-space data. The image-space data is then mapped by image rendering system 114 into optical data for further video processing. For example, in a monochrome display, the image-space data may be mapped into the luminance values of pixels. In a color display, image-space data may be mapped into the luminance and false-color values of pixels. Video processing system 116 transforms the output optical data from image rendering system 114 into signals which drive pixels on display 118, which displays the image viewed by a user.

As discussed above, MR signals captured and processed by image measurement system 102 are output as k-space data 108. In general terms, data values in image space are then generated by taking the inverse Fourier transform of k-space data 108. In general, MR signals are not measured as a continuous function of position in k-space. They are sampled at discrete k-values. Subject to specific constraints and boundary conditions, image quality generally improves as the density and range of discrete k-space sample points are increased. For other modalities, k-space is also referred to as spatial-frequency domain.

Coordinates of points in k-space may be specified with respect to a 3-D Cartesian grid, analogous to the common x-y-z Cartesian grid in real space. For MRI analysis, the axes are $k_x$=frequency (also called readout), $k_y$=phase encoding, and $k_z$=slice selection. Alternative coordinate systems, such as polar coordinates, may also be used. The locus of points in k-space along which data is sampled is referred to as the scan trajectory. The simplest trajectories are linear. For example, in a 2-D scan, a value of $k_y$ is held fixed while data is sampled at different values of $k_x$. The linear scans along $k_x$ are then repeated for other fixed values of $k_y$. A disadvantage of linear Cartesian scans is that the scan pattern is relatively slow in the $k_y$ direction.

Acquisition speed may be increased by various techniques. For example, radial or spiral trajectories may be used instead of linear ones. As discussed above, k-space values may be intentionally under-sampled. Images reconstructed from under-sampled data, however, are often degraded by severe artifacts and low SNR. Image quality may be enhanced via iterative MR reconstruction schemes. (See, for example, T-C Chang, et al., MR Image Reconstruction from Sparse Radial Samples Using Bregman Iteration, *Proc.* 14*th. Annual Meeting of ISMRM*, Seattle, Wash., 2006.) In these schemes, the $L_1$ norm of the sparse representations of the image-space data is minimized, subject to the constraint of k-space data fidelity. A sparse representation of an image is a set of transformed domain coefficients that has much fewer non-zero values than the image of interest. Using the set of coefficients, the image of interest may be constructed, rendered, and displayed.

The problem can be expressed as:

$$\min_{f} \|\varphi(f)\|_1 \quad \text{subject to} \quad Af = y, \tag{E1}$$

where $f$ is the image-space data arranged in a vector form, $\phi(\square)$ transforms the image-space data into a sparse representation, y is the measured k-space data arranged in a vector form, and matrix A is a Fourier operator that maps the image-space data into k-space data. Here, $\|\cdot\|_p$ refers to the $L_p$ norm. The image is rendered from $f$-values which solve the minimization E1.

The optimization problem of E1 is equivalent to the unconstrained optimization:

$$\min_{f} \{\psi(f)\}, \tag{E2}$$

with $\psi(f) = \lambda\|\varphi(f)\|_1 + \|Af - y\|_2^2$.

Here, $\psi(f)$ is a cost functional, $\lambda \geq 0$ is a Lagrange multiplier, and $\|Af-y\|_2^2$ is a data fidelity term. In an embodiment, an iterative non-linear conjugate gradient (CG) method is used to calculate $f$-values which solve the minimization E2. The solution at iteration k is $$f_{k+1} = f_k + \alpha_k d_k, \tag{E3}$$

where $$d_{k+1} = -\nabla\psi(f_{k+1}) + \beta_{k+1} d_k \tag{E4}$$

$$d_0 = -\nabla\psi(f_0) \tag{E5}$$

$\beta_{k+1}$ is the update direction:

$$\beta_{k+1} = \frac{|\nabla \psi(f_{k+1})|^2}{|\nabla \psi(f_k)|^2}, \tag{E6}$$

$\alpha_k$ is the step size:

$$\alpha_k = \underset{\alpha}{\operatorname{argmin}} \psi(f_k + \alpha d_k). \tag{E7}$$

In E7, a search for $\alpha_k$ may be performed with a backtracking line search method. An example of a backtracking line search method is given by the pseudo-code:

given a descent direction d for the energy functional $\psi$, $\gamma \in (0, 0.5), \delta \in (0, 1)$;
initializing $\alpha := 1$;
and while $\psi(f+\alpha d) > \psi(f) + \gamma\alpha\nabla\psi(f)^T d$, setting $\alpha := \delta\alpha$.

Using this formulation, the number of iterations necessary for convergence is high. The cost of each CG iteration is high as well, due to the non-Cartesian nature of the trajectory. The gradient of the data fidelity term in E2 is $A^\dagger(Af-y)$. Fast Fourier transform (FFT) is not directly applicable when applying the Fourier operator A to the image-space data and its adjoint $A^\dagger$ to the k-space data. Conventionally, gridding and inverse gridding methods are used. (See, for example, J. I. Jackson, et al., Selection of a Convolution Function for Fourier Inversion Using Gridding, *IEEE Trans. Med. Imag.*, 10(3), 473-478, 1991.) The gridding accuracy trades off computational speed subject to the choice of gridding kernel. Furthermore, the use of a look-up table in the gridding methods trades off memory usage for computational speed. As a result, using gridding and inverse gridding for the data fidelity term is expensive for 2-D applications, and may be prohibitively high for 3-D applications.

Image reconstruction time may be greatly reduced by embodiments of the invention. In an embodiment, a k-space weighting, equivalently interpreted as a density compensation function (DCF), is applied to the $L_2$ norm data fidelity term in E2. The minimization problem of E2 is then modified to $$\min_{f} \{\lambda\|\varphi(f)\|_1 + \|W(Af - y)\|_2^2\}, \tag{E8}$$

where W is a diagonal weighting matrix. The modified cost functional is $\lambda\|\phi(f)\|_1 + \|W(Af-y)_2\|^2$. The matrix $D=W^+W$ can be proportional to the density compensation function, which is well-known in gridding method. The weighting makes the residual nearly perpendicular to the descent direction at each iteration, and thus enables near optimal convergence. In an embodiment, the product of the Fourier operator and its adjoint is a block-Toeplitz matrix, and its operation on vectors may be evaluated by FFT. Gridding and inverse gridding time are reduced. The storage of the gridding look-up table is also eliminated.

In an embodiment, total variation (TV) may be used as $\|\phi(\square)\|_1$ due to its convexity, simplicity, and effectiveness for processing medical images. The models represented by E2 and E8 then become total variation regularization models, which are advantageous in a wide variety of restoration problems, such as denoising, deblurring, blind deconvolution, and in-painting. TV norm is effective in reducing oscillations without penalizing discontinuities. Thus, it may mitigate streaking artifacts while preserving edge definition. By selecting different values for $\lambda$, a user may select the level of detail desired in the reconstructed image. The Lagrange multipliers $\lambda$ is usually chosen relatively small to emphasize the data fidelity term and avoid artifacts introduced by over-penalizing the TV norm. Examples of artifacts include staircasing (blocking) and degradation of contrast, geometry, and texture. The convergence of the algorithm is, therefore, largely decided by the data fidelity term.

In an embodiment, as shown above in E8, a diagonal weighting matrix W is incorporated in the data fidelity term. A value for W that achieves near optimal convergence may be calculated by the following procedure. Referring to E3 and given the $f$-values after the $(k-1)^{th}$ iteration $f_{k-1}$, the $k^{th}$ image, without considering the TV gradient (the first term in E8) and any scalar factor, is approximately $$f_k \approx f_{k-1} + (-A^\dagger DAf_{k-1} + A^\dagger Dy) \quad (E9)$$
$$= A^\dagger Dy + (I - A^\dagger DA)f_{k-1}$$

where I refers to the identity matrix.
Herein, the $k^{th}$ image refers to set of $f$-values=$f_k$.
To achieve optimal convergence, the following residual is set equal to 0:

$$Af_k - y = AA^\dagger Dy + (A - AA^\dagger DA)f_{k-1} - y \quad (E10)$$
$$= (AA^\dagger D - I)y + (I - AA^\dagger D)Af_{k-1}$$
$$= (AA^\dagger D - I)(Af_{k-1} - y) = 0,$$

For $Af_{k-1} \neq y$, the solution of E10 is $$D = (AA^\dagger)^{-1} \quad (E11)$$

$$W = (AA^\dagger)^{\frac{1}{2}}. \quad (E12)$$

The physical meaning of this solution may be clarified by comparing the matrix form of gridding method with a least-squares solution of the MR signal model (see R. V. de Walle, et al., Reconstruction of MR Images from Data Acquired on a General Nonregular Grid by Pseudoinverse Calculation, *IEEE Trans. Med. Imag.*, 12(19): 1160-1167, 2000).
Based on gridding, $$I_g = A^\dagger D'y, \; D' = \text{diag}(d_i) \quad (E13)$$

where $I_g$ is the image from gridding reconstruction.
Based on least squares, $$I_{LS} = A^\dagger (AA^\dagger)^{-1} y \quad (E14)$$

where $I_{LS}$ is the image from least-squares reconstruction.
If $I_g$ is set equal to $I_{LS}$, the density compensation matrix in E13 is a diagonal approximation of $(AA^\dagger)^{-1}$ in E14. The same approximation may also be used to find the weighting matrix D. The weighting matrix W is then found by taking the square root of D's diagonal elements. The calculation of matrix D and matrix W are further discussed below.

Another interpretation of the solution (E11 and E12) is that applying the weighting W orthogonalizes the Fourier operator A. For Cartesian sampling, Fourier operator A is orthogonal, meaning that the output of taking the FFT and then inverse FFT will yield an identical result as the input. With non-Cartesian sampling (e.g. radial sampling) A is no longer orthogonal. With E12, however, the weighted Fourier operator B=WA satisfies the equation $$B^+B = (WA)^+WA = A^\dagger W^+ A = A^\dagger (AA^\dagger)^{-1} A = I. \quad (E15)$$

This suggests that a near optimal convergence is achieved when the projection operator A in the general model, as represented in E1, is orthogonal. Compared to the model represented in E2, the model represented in E8 has a relatively greater emphasis on the high frequency measurements. This suggests that the new optimization, represented in E8, will favor high resolution fine details rather than low resolution contrast in the image. It has the potential, however, for amplifying noise or other artifacts. The Lagrange parameter λ may be chosen relatively large to reduce these amplified oscillations.

While calculating the gradient and the cost functional represented in E8, the Fourier operator A is frequently applied to the image-space data, followed by its adjoint $A^\dagger$. In the following example, the instance of radial sampling in k-space is discussed. If a 2-D N×N image is arranged as a vector of $N^2$ length, and if there are $N_r$ radial lines, with $N_+$ samples acquired for each radial line, the matrix A then has a size of $(N_r N_+) \times N^2$. Direct evaluation of $Af$ in 2-D applications is computationally intense. Three-dimensional applications are even more intensive. One approach to accelerating this evaluation is through gridding and inverse gridding which approximates A and $A^\dagger$ with $$A = TFP, \; A^\dagger P^+ F^+ T^+, \quad (E16)$$

where T is a sparse interpolation matrix with non-zero entries defined by the kernel function $$t_{j,i} = \Phi\left(x_j - \frac{l}{\mu N}\right),$$

F is a regular Cartesian Fourier matrix which may be efficiently calculated using FFT, and P is deapodization diagonal matrix assembled by the Fourier transform of Φ. The gridding accuracy is controlled by the choice of kernel function Φ, and its parameters L (kernel size), and μ (over-sampling rate). As the values of L and μ increase, the accuracy of the approximation increases. The computational time and memory usage however, also increase. The matrix T is usually pre-constructed and stored in memory to avoid the kernel calculation on the fly. Although T is sparse, it still occupies a large memory, especially in 3-D instances and instances with large values of L.

In an advantageous embodiment, the block-Toeplitz nature of the product $A^\dagger DA$ is used to reduce computational time and memory usage. The Toeplitz characteristic of $A^\dagger A$ has been previously used for solving a general non-uniform inverse FFT (NU-IFFT) problem and other applications. (See, for example, Q. H. Liu and X. Y. Tang, Iterative Algorithm for Nonuniform Inverse Fast Fourier Transform (NU-IFFT), *Electronic Letters*, 34: 1913-1914, 1998, and J. A. Fessler, et al., Toeplitz-Based Iterative Reconstruction for MRI with Correction for Magnetic Field Inhomogeneity, *IEEE Trans. Sig. Proc.*, 53: 3393-3402, 2005.) The matrix $A^\dagger DA$ may be written as $$A^\dagger DA = \sum_{p,q \in \Omega} \sum_{m=1}^{M} d_m e^{i2\pi k_m(p-q)/N} \quad (E17)$$

where $d_m$ is the $m^{th}$ element on the diagonal of weighting matrix D, $k_m$ is the k-space coordinates of the $m^{th}$ sample on the trajectory, and p, q are indexes of image-space Ω. E17 shows that the elements of $A^\dagger DA$ are only dependent on p−q. Therefore, only a small portion of elements are independent. A sub-matrix assembled by these independent elements is denoted by Γ. The sub-matrix Γ has a matrix size of $M_\Gamma = (2N-1)^d$. Furthermore, the conjugate symmetry gives $\Gamma_n = \Gamma^*_{-n}$. Consequently, only $(M_\Gamma + 1)/2$ elements, out of $N^{2d}$, need to be calculated in a d-dimension case. They can be either evaluated exactly using E17 or approximately using gridding method.

Applying the operator $A^\dagger DA$ on an image vector $f$ becomes a d-dimensional convolution between the matrix $\Gamma$ and the d-dimensional image $f^d$. According to the convolution theorem, it can be computed fast with d-dimensional FFT. Therefore, we have $$A^\dagger DAf = \sum_{p\in\Omega}\sum_q \Gamma_{p-q} f_q^d = IFFT(FFT(\Gamma) \cdot FFT(f^d)). \quad (E18)$$

Above, IFFT is the inverse FFT operator. Note that $A^\dagger DA$ is only dependent on the sampling trajectory, not the measurements. Thus, FFT ($\Gamma$) can be evaluated only once beforehand and then used for all the iterations. Each calculation of E16, therefore, essentially consists of one FFT and one IFFT. Compared to gridding and inverse gridding approach, the interpolation and deapodization steps are eliminated, and the storage of interpolation matrix T is avoided.

Figure 2:
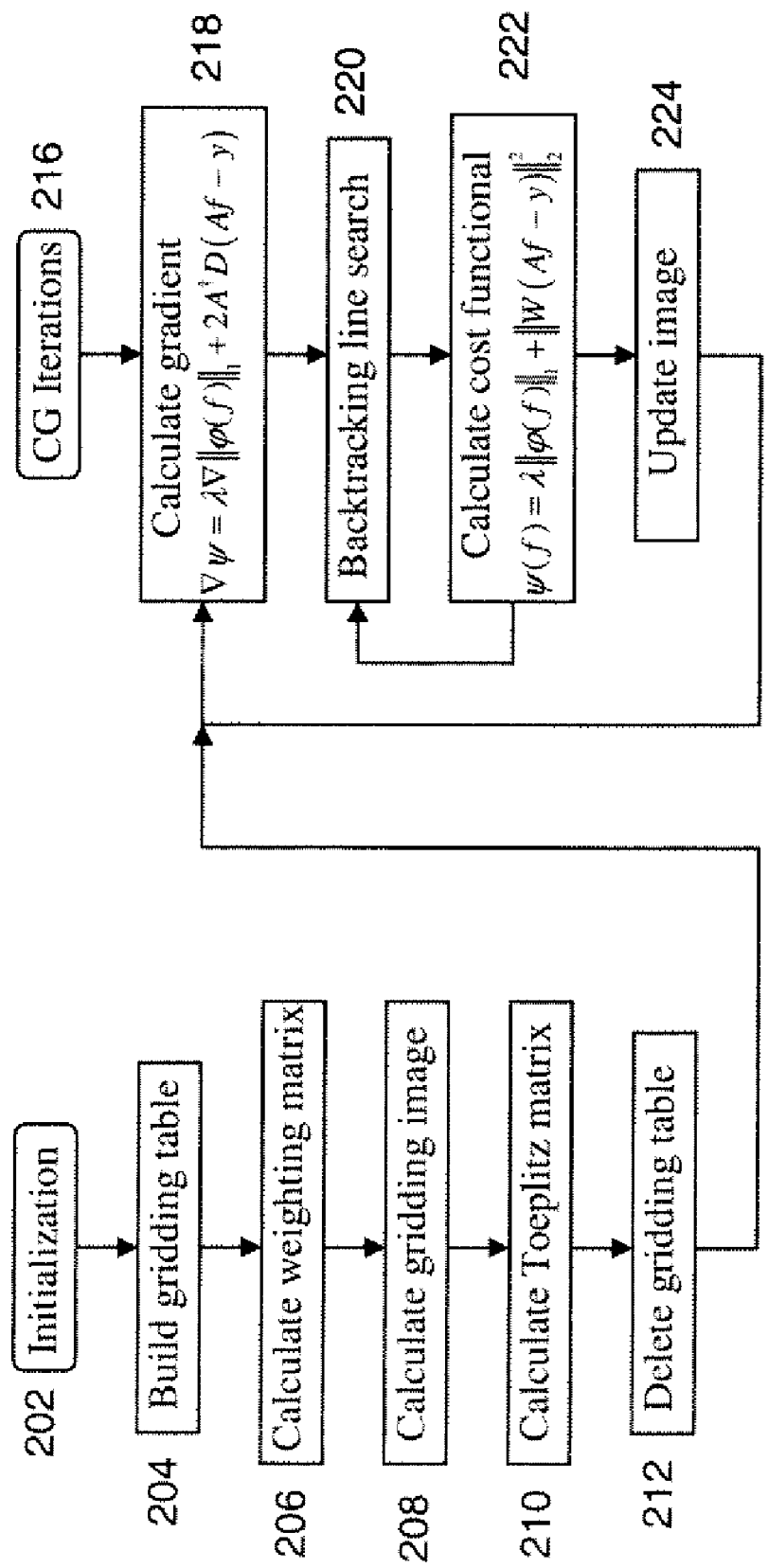
FIG. 2 shows a high-level flowchart of an image reconstruction process.

FIG. 2 shows a high-level flowchart for an embodiment of a process for reconstructing an image from a set of k-space data. The process comprises two major phases, a one-time initialization phase 202 and a non-linear conjugate gradient (CG) iteration phase 216. In step 204, a gridding table is built in random access memory (RAM). In step 206, a weighting matrix D is calculated. In step 208, a gridding image is calculated. The gridding image is the density compensated reconstruction image $I_g = A^\dagger Df$. In step 210, the independent elements of the Toeplitz matrix $A^\dagger DA$ are calculated. After the above values have been calculated, gridding is no longer needed. Therefore, in step 212, the gridding table is deleted to reduce RAM usage. The values calculated from the initialization phase are provided as input to step 218 in the CG iteration phase 216.

The CG iteration phase 216 comprises a series of iterations of steps 218-224. In step 218, using the values calculated in steps 206-210 of the initialization phase 202, the gradient $\nabla\psi = \lambda\nabla\|\phi(f)\|_1 + 2A^\dagger D(Af-y)$ is calculated. In step 220, a backtracking line search process is then performed to find a proper step size using the Fletcher-Reeves formula (see, for example, J. E. Shewchuk, An Introduction to the Conjugate Gradient Method Without the Agonizing Pain, Edition 1-1/4, *School of Computer Science, Carnegie Mellon University*, Aug. 4, 1994, pp. 48 and 52). In step 222, the cost functional $\psi(f) = \lambda\|\phi(f)\|_1 + \|W(Af-y)\|_2^2$ is calculated. In step 224, the image valued is updated. Steps 220-224 are then iterated until stopping criteria is attained. Stopping criteria, for example, may be a predetermined number of iterations or a predetermined rate of convergence.

Examples of processes for some of the above steps are given herein.

The weighting matrix may be derived using various criteria. For example, an iterative method proposed by Pipe may be used. (See, for example, J. G. Pipe, Sampling Density Compensation in MRI: Rationale and an Iterative Numerical Solution, *Magn. Reson. Med.*, 41: 179-186, 1999, and J. G. Pipe, Reconstructing MR Images from Undersampled Data: Data-Weighting Considerations, *Magn. Reson. Med.*, 43: 867-875, 2000.) Pipe's work indicated that the density compensation function for a 2-D under-sampled radial trajectory should be linear within the region that is sampled above the Nyquist rate, and becomes flat in the under-sampled periphery region. The DCF is found by recursively computing:

$$W_{i+1} = \frac{W_i}{W_i \otimes C},$$

with an initial $$W_1 = \frac{S}{S \otimes C} \quad (E19)$$

where C is a circular convolution kernel (bell shape), and S is the k-space sampling function. The iterations stop when $E = S \times (W \otimes C)$ becomes a 1 vector and the range of variation is considerably small, e.g., (0.99, 1.01).

An example of a process for calculating the Toeplitz matrix is described herein. The Toeplitz matrix is only trajectory dependent, and it is computed during the initialization phase. To calculate the $(2N-1)^d$ matrix $$\Gamma_n = \sum_{m=1}^M d_m e^{i2\pi k_m \cdot n/N}, \; n \in (-N+1, N-1)^d, \quad (E20)$$

it is divided into $2^d$ blocks, half of which can be obtained via conjugate symmetry from the other half. These blocks are calculated by applying gridding method to reconstruct a phase-shifted DCF vector. For example, the $n\in(0, N-1)^d$ block is calculated as $$\Gamma_n = \sum_{m=1}^M d_m e^{i\pi k_m} e^{i2\pi k_m \cdot r/N}, \; r \in (-N/2, N/2-1)^d. \quad (E21)$$

An example of calculating the gradient of a cost functional is described herein. In the general 3-D instance, the gradient of the cost functional is $$\nabla\psi = \lambda\nabla\|\phi(f)\|_1 + 2A^\dagger D(Af-y). \quad (E22)$$

It includes the TV term $$\nabla\|\varphi(f)\|_1 = \varphi^x_{i-1,j,k} - \varphi^x_{i,j,k} + \varphi^y_{i,j-1,k} - \varphi^y_{i,j,k} + \varphi^z_{i,j,k-1} - \varphi^z_{i,j,k}, \quad (E23)$$

where $$\varphi^x_{i,j,k} = \frac{(\nabla f_x)_{i,j,k}}{\sqrt{(\nabla f_x^2)_{i,j,k} + (\nabla f_y^2)_{i,j,k} + (\nabla f_z^2)_{i,j,k} + \eta}} \quad (E24)$$

$$\varphi^y_{i,j,k} = \frac{(\nabla f_y)_{i,j,k}}{\sqrt{(\nabla f_x^2)_{i,j,k} + (\nabla f_y^2)_{i,j,k} + (\nabla f_z^2)_{i,j,k} + \eta}}$$

$$\varphi^z_{i,j,k} = \frac{(\nabla f_z)_{i,j,k}}{\sqrt{(\nabla f_x^2)_{i,j,k} + (\nabla f_y^2)_{i,j,k} + (\nabla f_z^2)_{i,j,k} + \eta}}$$

and the $L_2$ data fidelity term $$A^\dagger D(Af-y) = A^\dagger DAf - A^\dagger Dy = TP(f) - I_g, \quad (E25)$$

where $TP(f)$ stands for the Toeplitz operation, and $I_g$ is the density compensated gridding reconstruction.

A process for calculating the cost functional is described herein. As a general instance, the 3-D cost functional is $$\psi(f) = \lambda\|\phi(f)\|_1 + \|W(Af-y)\|_2^2 \quad (E26)$$

It again includes the TV term $$\|\varphi(f)\|_1 = \sum_{i,j,k} \sqrt{(\nabla f_x^2)_{i,j,k} + (\nabla f_y^2)_{i,j,k} + (\nabla f_z^2)_{i,j,k} + \eta} \quad (E27)$$

and the data fidelity term $$\|W(Af - y)\|_2^2 = (Af - y)^\dagger W^\dagger W(Af - y) \quad (E28)$$
$$= f^\dagger A^\dagger DAf - y^\dagger DAf - f^\dagger A^\dagger Dy + y^\dagger Dy$$
$$= f^\dagger A^\dagger DAf - 2\text{Re}(f^\dagger A^\dagger Dy) + y^\dagger Dy$$
$$= f^\dagger \cdot TP(f) - 2\text{Re}(f^\dagger I_g) + y^\dagger Dy$$

where Re(□) indicates the operation for taking the real part. Note that the most time-consuming part, TP(f), is shared by both the gradient and cost functional computation, and the left operations are mainly the calculations of vector norms.

Figure 3:
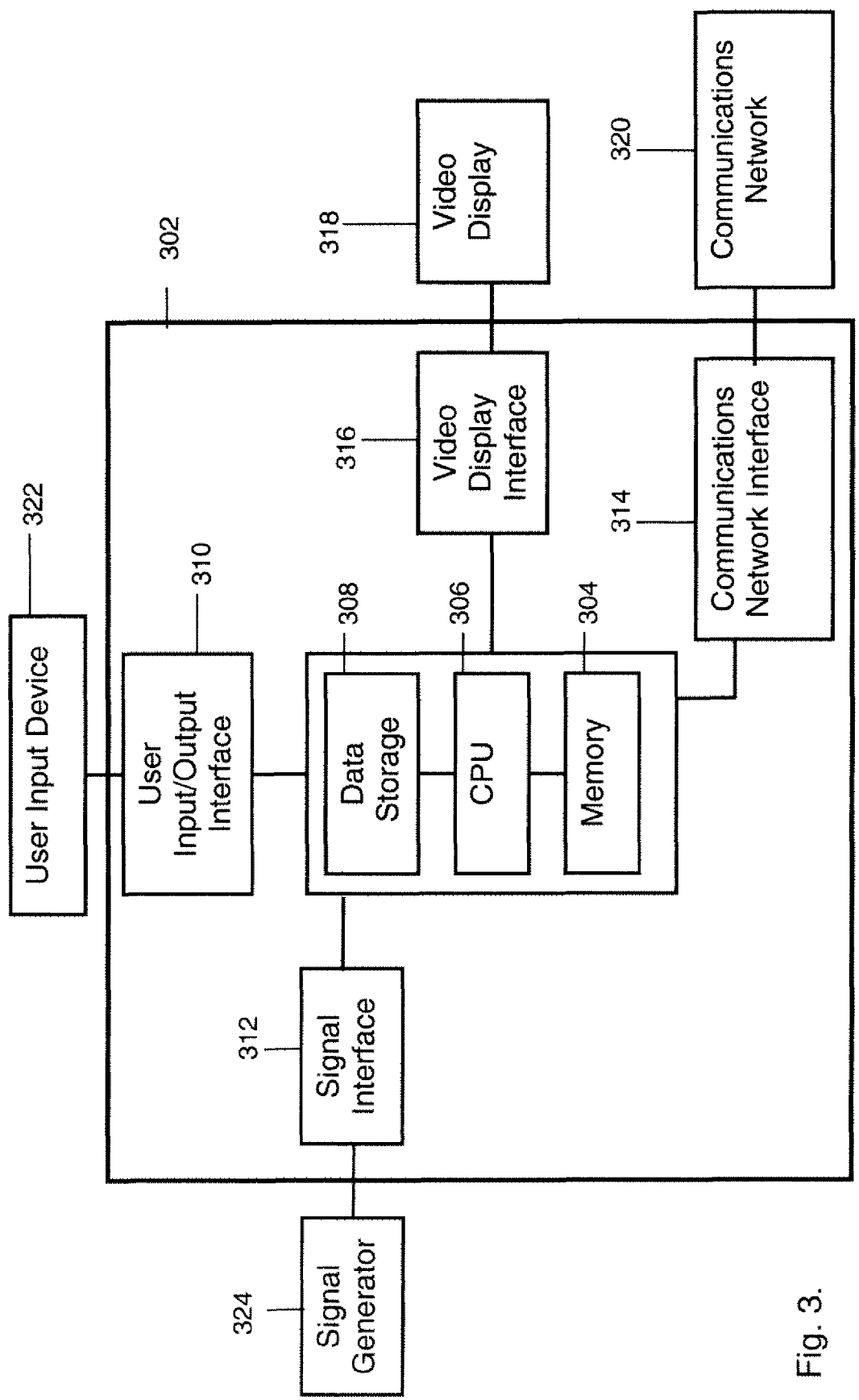
FIG. 3. shows a high-level schematic of a computer for performing image reconstruction.

One embodiment of an image processing system 110 (FIG. 1) may be implemented using a computer. As shown in FIG. 3, computer 302 may be any type of well-known computer comprising a central processing unit (CPU) 306, memory 304, data storage 308, and user input/output interface 310. Data storage 308 may comprise a hard drive or non-volatile memory. User input/output interface 310 may comprise a connection to a user input device 322, such as a keyboard or mouse. As is well known, a computer operates under control of computer software which defines the overall operation of the computer and applications. CPU 306 controls the overall operation of the computer and applications by executing computer program instructions which define the overall operation and applications. The computer program instructions may be stored in data storage 308 and loaded into memory 304 when execution of the program instructions is desired. Computer 302 may further comprise a signal interface 312 and a video display interface 316. Signal interface 312 may transform incoming signals, such as from measurement system 102 (FIG. 1), to signals capable of being processed by CPU 306. Video display interface 316 may transform signals from CPU 306 to signals which may drive video display 318. Computer 302 may further comprise one or more network interfaces. For example, communications network interface 314 may comprise a connection to an Internet Protocol (IP) communications network 320. Computers are well known in the art and will not be described in detail herein.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A computer-implemented-method for rendering an image from a set of k-space data, comprising the steps of:
   constructing a cost functional based at least in part on said set of k-space data, said cost functional comprising $\lambda\|\phi(f)\|_1 + \|W(Af-y)\|_2^2$ wherein f is a vector representing said set of image-space data, λ is a Lagrange multiplier, y is a vector representing said set of k-space data, φ(f) is an operator which transforms f into a sparse representation, A is a Fourier operator which maps said set of image-space data into said set of k-space data, and W is said weighting matrix;
   iteratively solving for a set of image-space data, wherein said step of iteratively solving comprises the step of minimizing said cost functional; and,
   rendering said image from said set of image-space data.

2. The method of claim 1 wherein said step of iteratively solving further comprises the steps of:
   generating a block-Toeplitz matrix based at least in part on said weighting matrix; and,
   performing a plurality of first iterations based at least in part on said block-Toeplitz matrix elements, wherein each first iteration comprises the steps of:
   (a) calculating the gradient of said cost functional;
   (b) performing a plurality of second iterations, wherein each second iteration comprises the steps of:
      (b1) performing a backtracking line search; and,
      (b2) calculating a value of said cost functional; and,
   (c) updating said set of image-space data.

3. The method of claim 2, wherein said block-Toeplitz matrix comprises:

$A^\dagger DA$ wherein $D=(AA^\dagger)^{-1}$.

4. The method of claim 3 wherein said gradient of said cost functional comprises:

$\nabla\psi = \lambda\nabla\|\phi(f)\|_1 + 2A^\dagger D(Af-y)$.

5. The method of claim 3 wherein said step of iteratively solving further comprises the step of iteratively solving the equation:

$$f_k \approx f_{k-1} + (-A^\dagger DAf_{k-1} + A^\dagger Dy)$$
$$= A^\dagger Dy + (I - A^\dagger DA)f_{k-1}$$

wherein $f_k$ is the set of f-values after the k-th iteration and I is the identity matrix.

6. The method of claim 1 wherein $\|\phi(f)\|_1$ is a total variation.

7. An image processing system for rendering an image from a set of k-space data, comprising:
   means for constructing a cost functional based at least in part on said set of k-space data, said cost functional comprising:

$\lambda\|\phi(f)\|_1 + \|W(Af-y)\|_2^2$ wherein f is a vector representing said set of image-space data, λ is a Lagrange multiplier, y is a vector representing said set of k-space data, φ(f) is an operator which transforms f into a sparse representation, A is a Fourier operator which maps said set of image-space data into said set of k-space data, and W is said weighting matrix;
   means for iteratively solving for a set of image-space data, wherein said step of iteratively solving comprises the step of minimizing said cost functional; and,
   means for rendering said image from said set of image-space data.

8. The image processing system of claim 7, further comprising:
   means for generating a block-Toeplitz matrix based at least in part on said weighting matrix; and, means for performing a plurality of first iterations based at least in part on said block-Toeplitz matrix elements, wherein each first iteration comprises the steps of:
(a) calculating the gradient of said cost functional;
(b) performing a plurality of second iterations, wherein each second iteration comprises the steps of:
(b1) performing a backtracking line search; and,
(b2) calculating a value of said cost functional; and,
(c) updating said set of image-space data.

9. The image processing system of claim 8 wherein said block-Toeplitz matrix comprises:

$$A^\dagger DA$$

wherein $D=(AA^\dagger)^{-1}$.

10. The image processing system of claim 9 wherein said gradient of said cost functional comprises:

$$\nabla\psi=\lambda\nabla\|\phi(f)\|_1+2A^\dagger D(Af-y).$$

11. The image processing system of claim 9, further comprising means for solving the equation:

$$f_k \approx f_{k-1} + (-A^\dagger DAf_{k-1} + A^\dagger Dy)$$
$$= A^\dagger Dy + (I - A^\dagger DA)f_{k-1}$$

wherein $f_k$ is the set of f-values after the k-th iteration and I is the identity matrix.

12. The image processing system of claim 7 wherein $\|\phi(f)\|_1$ is a total variation.

13. A computer readable medium storing computer program instructions for rendering an image from a set of k-space data, the computer program instructions defining the steps of:
constructing a cost functional based at least in part on said set of k-space data, said cost functional comprising $$\lambda\|\phi(f)\|_1+\|W(Af-y)\|_2^2$$

wherein $f$ is a vector representing said set of image-space data, $\lambda$ is a Lagrange multiplier, y is a vector representing said set of k-space data, $\phi(f)$ is an operator which transforms $f$ into a sparse representation, A is a Fourier operator which maps said set of image-space data into said set of k-space data, and W is said weighting matrix;
iteratively solving for a set of image-space data, wherein said step of iteratively solving comprises the step of minimizing said cost functional; and,
rendering said image from said set of image-space data.

14. The computer readable medium of claim 13 wherein said computer program instructions further comprise computer instructions defining the steps of:
generating a block-Toeplitz matrix based at least in part on said weighting matrix; and,
performing a plurality of first iterations based at least in part on said block-Toeplitz matrix elements, wherein each first iteration comprises the steps of:
(a) calculating the gradient of said cost functional;
(b) performing a plurality of second iterations, wherein each second iteration comprises the steps of:
(b1) performing a backtracking line search; and,
(b2) calculating a value of said cost functional;
(c) updating said set of image-space data.

15. The computer readable medium of claim 14, wherein said block-Toeplitz matrix comprises:

$$A^\dagger DA$$

wherein $D=(AA^\dagger)^{-1}$.

16. The computer readable medium of claim 15, wherein said gradient of said cost functional comprises:

$$\nabla\psi=\lambda\nabla\|\phi(f)\|_1+2A^\dagger D(Af-y).$$

17. The computer readable medium of claim 15, wherein said computer instructions further comprise computer instructions for solving the equation $$f_k \approx f_{k-1} + (-A^\dagger DAf_{k-1} + A^\dagger Dy)$$
$$= A^\dagger Dy + (I - A^\dagger DA)f_{k-1}$$

wherein $f_k$ is the set of $f$-values after the k-th iteration and I is the identity matrix.

18. The computer readable medium of claim 13 wherein $\|\phi(f)\|_1$ is a total variation.

* * * * *